(12) United States Patent
Raftery et al.

(10) Patent No.: US 6,360,307 B1
(45) Date of Patent: Mar. 19, 2002

(54) CIRCUIT ARCHITECTURE AND METHOD OF WRITING DATA TO A MEMORY

(75) Inventors: Neil P. Raftery, Guildford (GB); Mathew R. Arcoleo, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/099,915

(22) Filed: Jun. 18, 1998

(51) Int. Cl.[7] .................... G06F 12/00; G06F 13/00; G06F 15/00
(52) U.S. Cl. .................... 711/169; 711/149; 712/33
(58) Field of Search ........................ 711/169, 149, 711/201, 118, 154, 167, 109; 712/33, 32

(56) References Cited

U.S. PATENT DOCUMENTS

| | | | |
|---|---|---|---|
| 3,931,613 A | 1/1976 | Gruner et al. | 340/172.5 |
| 4,393,482 A | 7/1983 | Yamada | 365/236 |
| 4,445,172 A | 4/1984 | Peters et al. | 364/200 |
| 4,677,594 A | 6/1987 | Bisotto et al. | 365/240 |
| 4,755,936 A | 7/1988 | Stewart et al. | 364/200 |
| 4,901,228 A | 2/1990 | Kodama | 364/200 |
| 4,933,909 A | 6/1990 | Cushing et al. | 365/230 |
| 5,187,783 A | 2/1993 | Mansfield et al. | 395/425 |
| 5,222,223 A | 6/1993 | Webb, Jr. et al. | 395/425 |
| 5,224,214 A | 6/1993 | Rosich | 395/250 |
| 5,257,236 A | 10/1993 | Sharp | 365/230 |
| 5,261,064 A | 11/1993 | Wyland | 395/400 |
| 5,293,623 A | 3/1994 | Froniewski et al. | 395/425 |
| 5,367,650 A | 11/1994 | Sharangpani et al. | 395/375 |
| 5,469,544 A | 11/1995 | Aastresh et al. | 395/290 |
| 5,497,470 A | 3/1996 | Liencres | 395/403 |
| 5,526,316 A | 6/1996 | Lin | 365/221 |
| 5,534,796 A | 7/1996 | Edwards | 326/93 |
| 5,566,124 A | 10/1996 | Fudeyasu et al. | 365/230 |
| 5,661,692 A | 8/1997 | Pinkham et al. | 365/230 |
| 5,668,967 A | 9/1997 | Olson et al. | 395/842 |
| 5,673,415 A * | 9/1997 | Nguyen et al. | 711/149 |
| 5,752,270 A * | 5/1998 | Wada | 711/169 |
| 5,787,489 A * | 7/1998 | Pawlowski | 711/169 |
| 5,875,346 A * | 2/1999 | Luick | 711/169 X |
| 6,021,480 A * | 2/2000 | Pettey | 711/201 |
| 6,065,107 A * | 5/2000 | Luick | 712/32 |

OTHER PUBLICATIONS

Intel Pentium Processor User's Manual vol. 1: Pentium Processor Data Book; Intel Corp. 1994; pp. 6–30 to 6–34.
MC88200 Cache/Memory Mangement Unit User's Manual (First Edition); Motorola, Inc. 1988; pp. 1–2 and 5–1 to 5–12.

* cited by examiner

*Primary Examiner*—Matthew Kim
*Assistant Examiner*—B. Peugh
(74) *Attorney, Agent, or Firm*—Wagner, Murabito & Hao LLP

(57) ABSTRACT

A memory device includes an address pipeline configured to receive a write address at a first time and to provide the write address to a memory array at a second time, corresponding to a time when write data associated with the write address is available to be written to the array. The address pipeline may include a series of registers arranged to receive the write address and to provide the write address to the memory array. In addition, the memory device may include a comparator coupled to the address pipeline. The comparator is configured to compare the write address to another address (e.g., a read address) received at the memory device. A bypass path to the array may be provided for read addresses received at the memory device. A data pipeline is configured to receive data destined for the memory device and to provide the data to the memory array. The data pipeline may include a data bypass path which does not include the memory array.

5 Claims, 12 Drawing Sheets

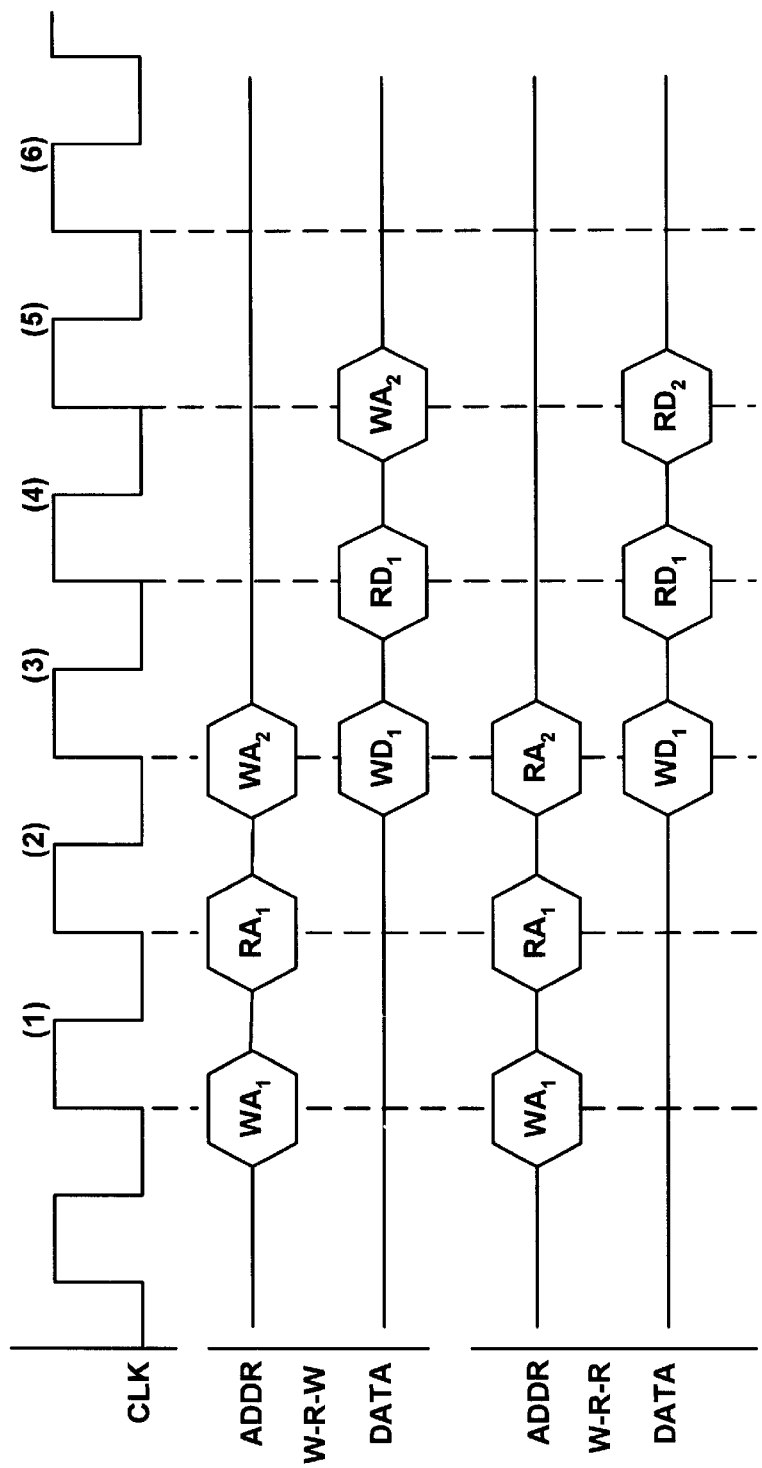
FIGURE 2A (CONT.) (CONVENTIONAL ART)

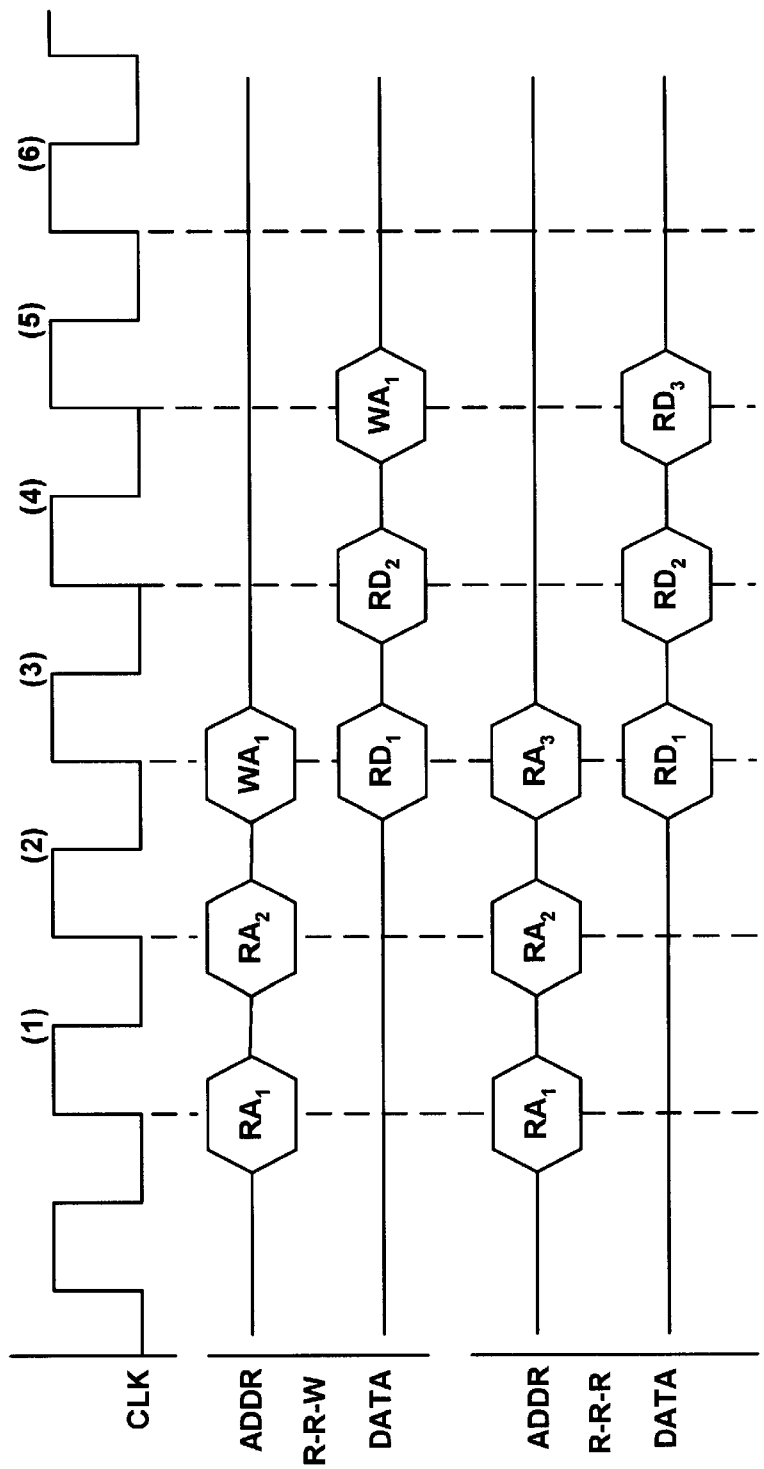
FIGURE 2B (CONT.) (CONVENTIONAL ART)

CIRCUIT ARCHITECTURE AND METHOD OF WRITING DATA TO A MEMORY

FIELD OF THE INVENTION

The present invention relates to late write architectures for memory devices wherein write data is received by a memory device sometime after a corresponding write address has been presented thereto and, in particular, those architectures wherein write data is stored in a buffer in the memory device and written to a memory Array thereof at a later time.

BACKGROUND

So-called late write memory architectures define industry standard methodologies for allowing a read operation to be initiated prior to the completion of a prior write operation. This feature increases data throughput in a memory by reducing latency between write and read operations. FIG. 1a illustrates a conventional pipelined read operation. As shown, because of delays involved with reading data from the memory device, the read data ($RD_1$) associated with a read address ($RA_1$) is not available until sometime after the read address has been presented to the memory device (e.g., two clock cycles after the read address for the illustrated example). Conversely, for the conventional write operation shown in FIG. 1b, the write data ($WD_1$) associated with a write address ($WA_1$) is available in same clock cycle as the write address. This timing difference between read and write operations leads to latencies where read and write operations are executed back-to-back. For example, as shown in FIG. 1c, for a sequence of write-read-write operations, because of the latency associated with the read operation the address ($WA_2$) associated with the second write operation must be delayed two clock cycles from the read address ($RA_1$), to allow the read operation to complete. Such latencies lead to overall slower operations for a system involving conventional memory devices.

Various schemes have been introduced to avoid the latency problems experienced with conventional memory devices. For example, burst memory architectures seek to execute a number of read or write operations back-to-back and thereby avoid latencies. Also, pipelining operations allow addresses associated with future operations to be presented on a bus before the associated data for the operation. For example, late write architectures, as shown in FIGS. 2a and 2b, allow write operations to resemble read operations in that the write data ($WD_X$) associated with a write address ($WA_X$) is presented on a data bus sometime after the write address is presented on an address bus. For the illustrated example, write data is available two clock cycles after a corresponding write address, just as read data ($RD_X$) is available two clock cycles after a corresponding read address ($RA_X$) is first presented. FIGS. 2a and 2b show that for any combination of reads and writes, there are no latencies experienced when the operations are executed back-to-back. What is desired, therefore, is a memory architecture which can support such late write schemes.

SUMMARY OF THE INVENTION

In one embodiment, the present invention provides a memory device which includes an address pipeline configured to receive a write address at a first time and to provide the write address to a memory array at a second time corresponding to a time when write data associated with the write address is available to be written to the array. The address pipeline may include a series of registers arranged to receive the write address and to provide the write address to the memory array. In addition, the memory device may include a comparator as part of the address pipeline. The comparator is configured to compare the write address to another address (e.g., a read address) received at the memory device. The address pipeline may also include a bypass path to the array for read addresses received at the memory device.

The memory device may further include a data pipeline configured to receive data destined for the memory device and to provide the data to the memory array. The data pipeline may include a data bypass path which does not include the memory array.

In another embodiment, the memory device address pipeline includes a first register configured to receive the write address and a parallel address path coupled between the first register and the memory array. One of the pair of the parallel address paths may include at least a second register and, in one particular embodiment, includes a pair of registers. In alternative embodiments, the address pipeline of the memory device may include a pair of parallel address paths to the memory array, the pair of parallel address paths sharing at least one register.

In a further embodiment, the present invention provides a method which includes pipelining a write address within a memory device such that the write address is provided to a memory array at a time when write data corresponding to that address is to be written to the array. For one particular embodiment, that time may be two clock cycles after the write address is first received at the memory device. In general, pipelining the write address includes passing the write address through a series of register stages of the memory device. Such passing may be controlled according to instructions received at the memory device after the write address has been received. The write address may be passed through at least two register stages during the pipelining. This embodiment may further include comparing the write address to read addresses received at the memory device.

These and other features and advantages of the present invention will be apparent from the detailed description and its accompanying drawings which follow.

BRIEF DESCRIPTION OF THE DRAWINGS

The present invention is illustrated by way of example, and not limitation, in the figures of the accompanying drawings in which.

DETAILED DESCRIPTION

Described herein is a memory device configured to operate in late write architecture environments. Such a memory device may find a number of applications in computer and other digital systems. For example, FIG. 3a illustrates an exemplary system which may employ a memory device configured in accordance with the present invention. System 10 includes a microprocessor 12 and memory 14 coupled together via a bus 16. Such an arrangement may be found in a general purpose computer or, for example where microprocessor 12 is an embedded processor, in dedicated systems. Bus 16 provides for the exchange of address data and control signals between microprocessor 12 and memory 14. In such an environment, bus 16 supports a late write protocol as described above for FIGS. 2a and 2b. Memory 14 may be a main memory for processor 12 or a cache memory (e.g., a first, second or even third or higher level cache).

Figure 3A:
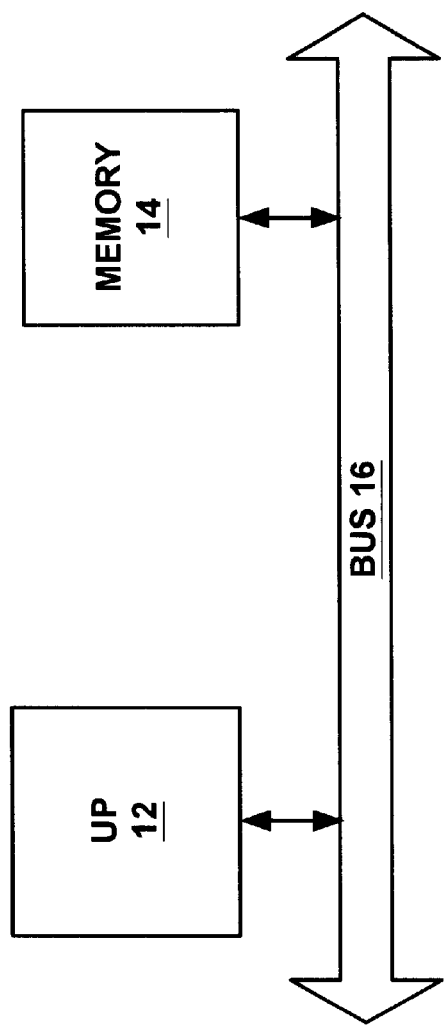
FIGS. 3a and 3b illustrate exemplary uses of a memory device configured in accordance with one embodiment of the present invention.
Figure 3B:
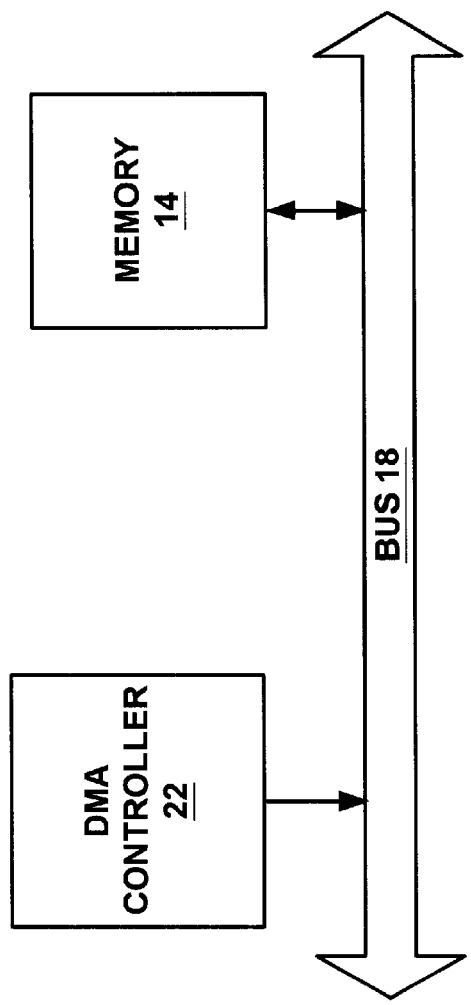

FIG. 3b illustrates an alternative system 20 which may employ a memory device 14 configured in accordance with the present invention. In this exemplary system, a bus 18 supports the exchange of address, data and control signals corresponding to the late write protocol between memory 14 and a direct memory access (DMA) controller 22. Such systems may be found within a variety of computer and other digital systems which support DMA transfers. Thus, the memory device to be described herein may find numerous applications, however, it should be kept in mind that the exemplary memory architectures to be described below are merely examples of the present invention. These examples are presented in order to better illustrate and explain the invention, however, the broader spirit and scope of the invention should in no way be limited thereby. For example, the memory architecture described herein may be used for embedded memory systems where memory is provided onboard programmable logic devices, application specific integrated circuits (ASICs) and the like.

Figure 4:
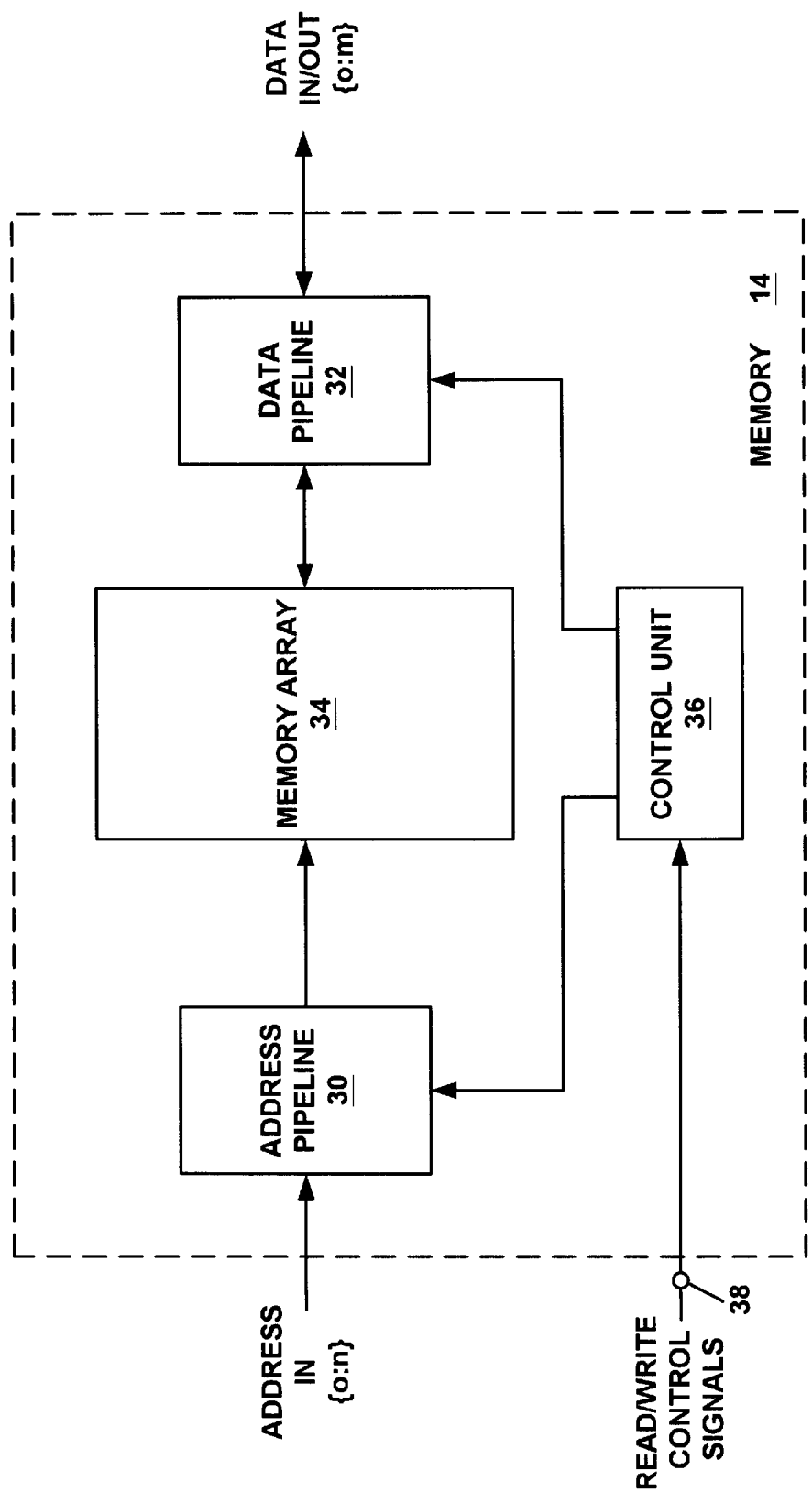
FIG. 4 illustrates a memory device having an address pipeline configured in accordance with an embodiment of the present invention.

Thus, an exemplary architecture for memory 14 is now shown in greater detail in FIG. 4. The architecture of memory 14 includes an address pipeline 30 and a data pipeline 32, each coupled to a memory array 34. Memory array 34 may be made up of conventional memory cells, for example, static random access memory (SRAM) cells or dynamic random access memory (DRAM) cells. In other embodiments, some or all of the memory cells of memory array 34 may be non-volatile memory cells. Address pipeline 30 receives address signals, for example from a bus 16 or 18, and data pipeline 32 receives data signals, for example, from a bus 16 or 18. A control unit 36 within memory device 14, provides control signals to both address pipeline 30 and data pipeline 32 to allow for storage and retrieval of data from memory array 34. Control unit 36 provides the control signals based upon read and write control signals 38, for example as received from a bus 16 or 18. The particular address decoding schemes, bit line and/or word line driver circuitry, equalizations circuitry and other memory array access circuitry used by memory 14 are not particularly important for an understanding of the present invention and may be conventional in design. Therefore, such details are not described further.

Figures 1A, 1B, 1C:
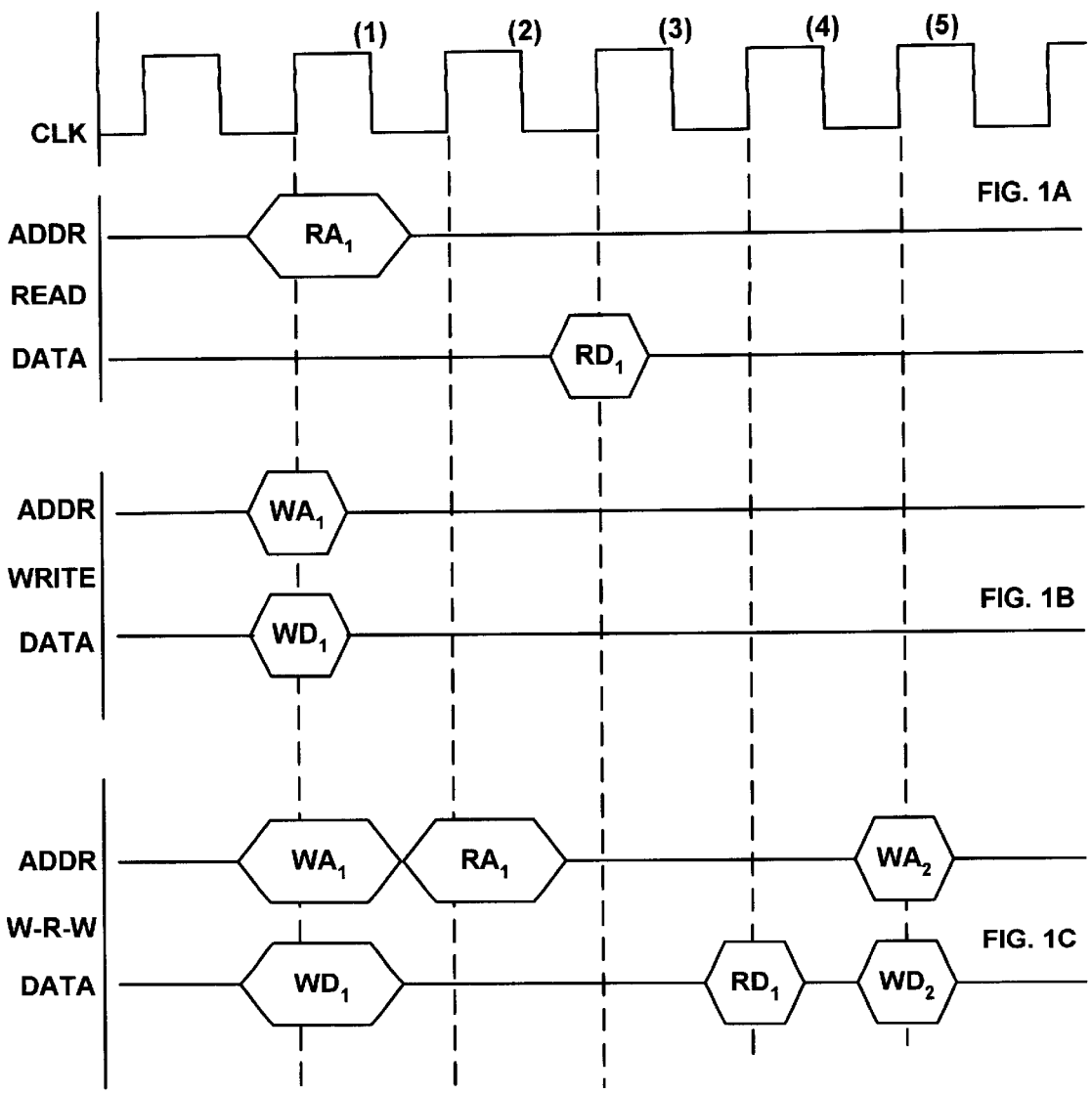
FIG. 1a illustrates a conventional read operation.
FIG. 1b illustrates a conventional write operation.
FIG. 1c illustrates latencies introduced in conventional write after read memory operations.
Figure 2A:
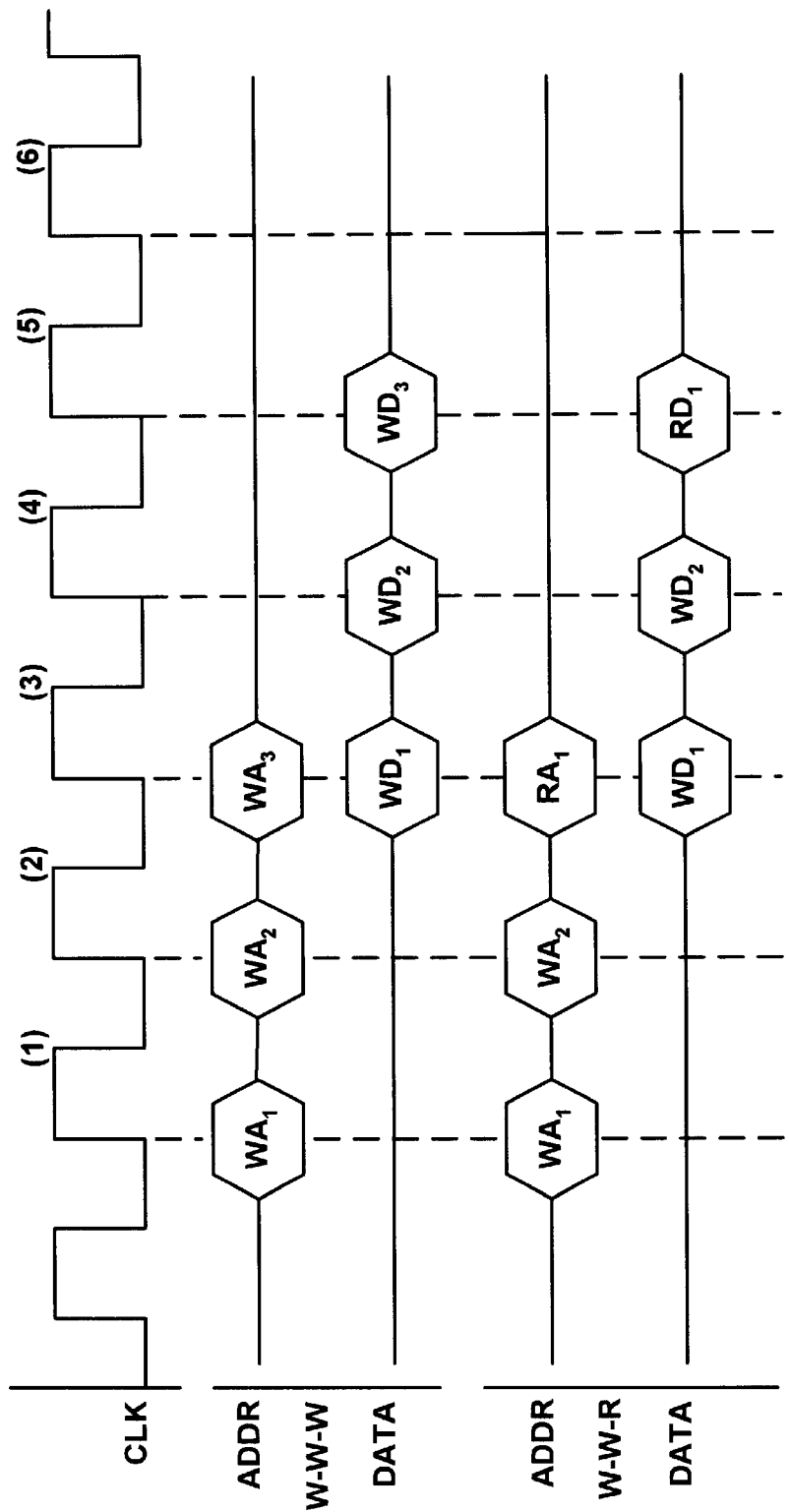
FIGS. 2a and 2b illustrate write and read operations for late write architectures.
Figure 2B:
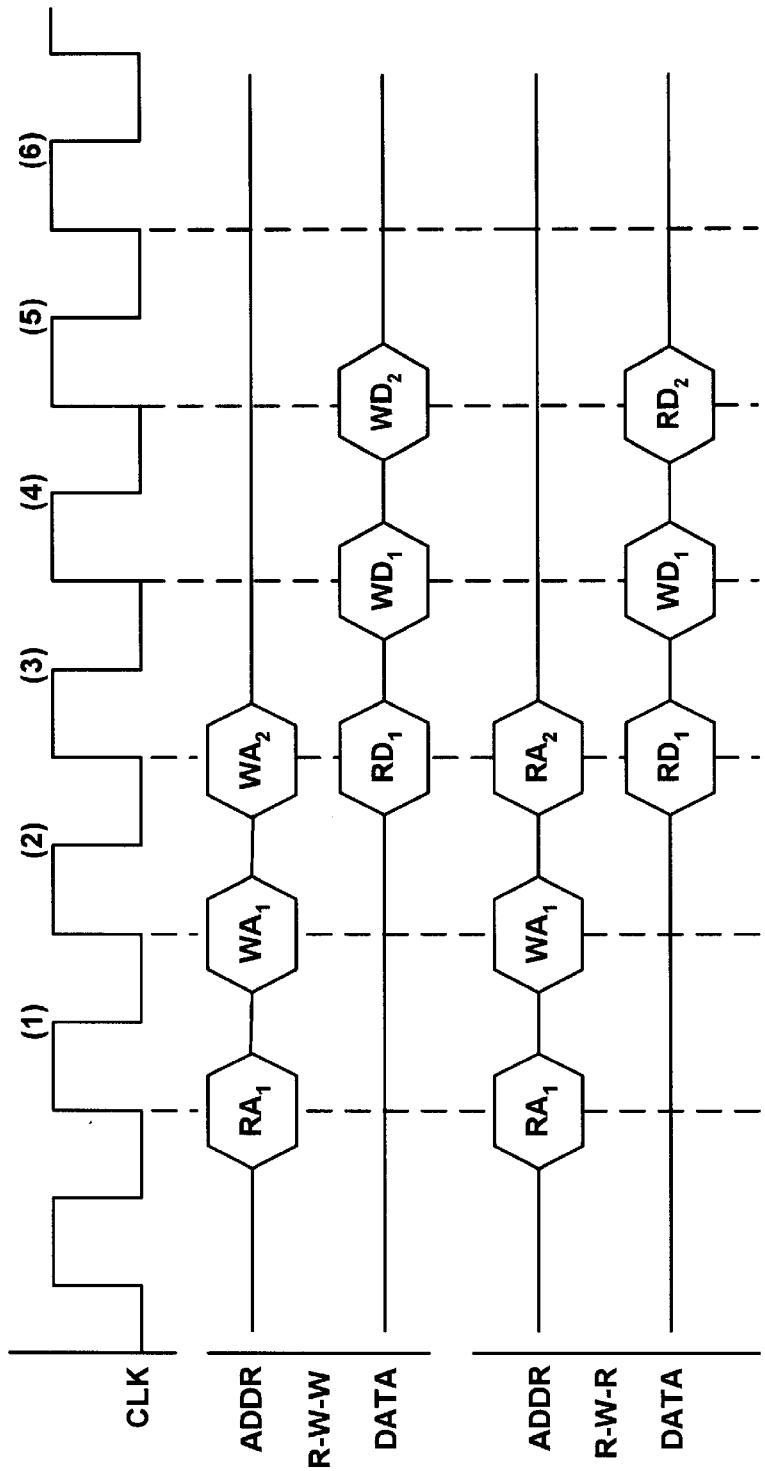

Memory 14 supports a late write bus protocol in which write data is provided to memory 14 two clock cycles after its associated write address (e.g., as shown in FIGS. 2a and 2b). Also, read data is provided from memory 14 two clock cycles after receipt of an associated read address. In accordance with such protocols, memory device 14 is able to support any combination of reads and writes with zero latency. Of course, any read data provided by memory 14 is always the most recent copy of such data. Thus, a compare function is provided, and will be discussed in further detail below, to ensure that any read after write to the same address will receive the most recent copy of the data.

To support the above protocols, address pipeline 30 and data pipeline 32 are capable of storing up to two write addresses and up two data words, respectively. In addition, memory 14 is capable of carrying out a read operation while storing up to two write addresses. Thus, address pipeline 30 and data pipeline 32 ensure that a write address and its corresponding data (received two clock cycles after the write address) are presented to memory array 34 at the same time. In addition, in order to meet the two cycle requirement for reads, any read address received by address pipeline 30 is presented immediately to memory array 34 so that associated data may be read out of memory 14 two clock cycles after the read address has been received. Again, these constraints are met under any combination of read or write cycles.

Thus, memory 14 includes an address pipeline 30 configured to receive a write address at a first time and to provide the write address to a memory array 34 at a second time, corresponding to a time when write data associated with the write address is available to be written to the array 34. As will be discussed below, address pipeline 30 may include a series of registers arranged to receive the write address and to provide the write address to the memory array 34. In addition, address pipeline 30 may include a comparator configured to compare write address stored in the pipeline to another address (e.g., a read address) received at memory 14. To accommodate the two cycle constraint for reads, address pipeline 30 may include a bypass path to memory array 34 for read addresses received at memory 14.

Data pipeline 32 is configured to receive data destined for memory array 34 and to provide the data thereto. To accommodate reads which are to an address currently stored in address pipeline 30, data pipeline 32 may include a data bypass path which does not include memory array 34. In this way, the most recent copy of the data can be used to satisfy the read operation.

In one embodiment, the memory device address pipeline includes a first register configured to receive the write address and parallel address paths coupled between the first register and the memory array. One of the parallel address paths may include at least a second register and, in one particular embodiment, includes a pair of registers. In alternative embodiments, the address pipeline of the memory device may include a pair of parallel address paths to the memory array, the pair of parallel address paths sharing at least one register.

Figure 5:
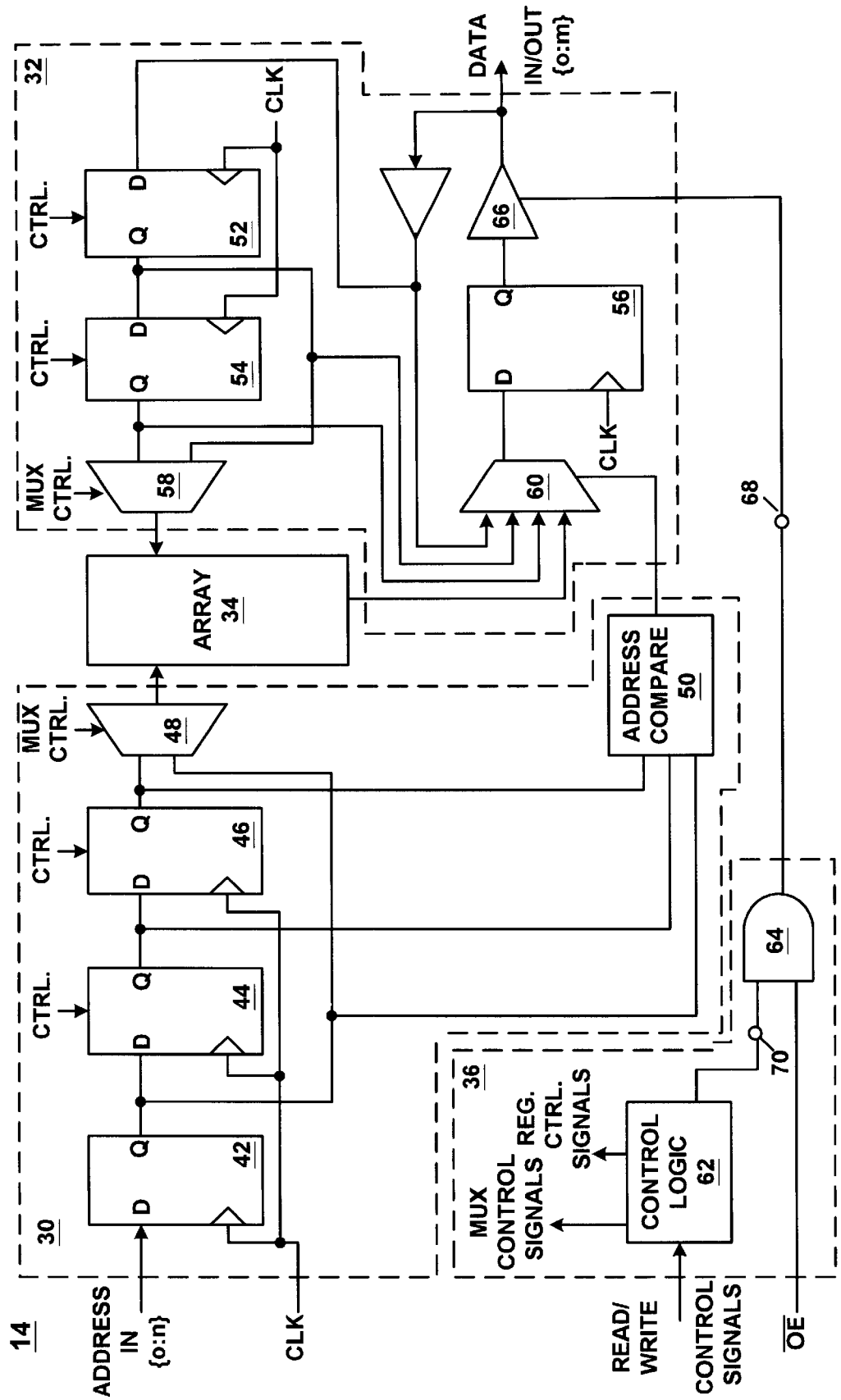
FIG. 5 illustrates an exemplary embodiment of the memory device shown in FIG. 4 in more detail.

One exemplary embodiment of memory 14 is now shown in detail in FIG. 5. As illustrated, the path for a single address bit and a single data bit through address pipeline 30 and data pipeline 32, respectively, are detailed. Similar paths are provided for all address bits <0:n> and data bits <0:m>. Address pipeline 30 includes registers 42, 44 and 46 and a multiplexer 48. Data pipeline 32 includes registers 52, 54 and 56 as well as multiplexers 58 and 60. Control unit 36 includes control logic 62 and AND gate 64.

Address pipeline 30 also includes an address compare unit 50 which allows for comparing read addresses received at memory device 14 with write addresses stored in address pipeline 30 as described above. In operation, read addresses received at address pipeline 30 are clocked into register 42, for example on the rising edge of the clock signal (CLK)

which defines the associated read operation. Through appropriate control of multiplexer 48 (e.g., via a multiplexer control signal provided by control logic 62 in response to read/write control signals received at memory device 14), the read addresses are immediately presented to array 34. At the same time, the read address stored in register 42 is presented to address compare unit 50 which also receives any write addresses stored in register 44 or register 46. If address compare unit 50 determines that the read address does not match any of the stored write addresses, read data is routed from array 34 through multiplexer 60 (which operates under the control of address compare unit 50) to data output register 56. That data is ultimately provided to a data bus coupled to memory unit 14, for example by appropriate operation of an output buffer 66 which operates under the control of an output control signal 68. Output control signal 68 may be the logical (i.e., AND) combination of an output enable signal $\overline{OE}$ received at memory 14 and a control signal 70 provided by control logic 62 which is produced as a result of read/write control signals received at memory 14. If, however, address compare unit 50 determines that the read address corresponds to one of the stored write addresses in either of registers 44 or 46, address compare unit 50 provides appropriate control signals to multiplexer 60 to allow the associated write data which may be stored in or received at data pipeline 32, to be provided to data register 56 and, subsequently, to the data bus.

The arrangement of registers 42, 44 and 46 of address pipeline 30 allows for pipelining a write address within memory 14 such that the write address is provided to memory array 34 at a time when write data corresponding to that address is to be written to array 34. For the illustrated embodiment, that time may be two clock cycles after the write address is first received at memory 14, i.e., two clock cycles after the write address is clocked into register 42. Pipelining the write address is accomplished by passing the write address through a series of registers stages (i.e., registers 44 and 46) of memory 14. Such passing is controlled according to instructions received at memory 14 after the write address has been received. In other words, control logic 62 provides appropriate register and multiplexer control signals to allow the write address to be presented to array 34 at the appropriate time, based on read/write control signals received at memory 14 after the write address has been clocked into register 42.

To illustrate, consider that write addresses stored in address pipeline 30 are always provided to memory array 34 from register 46. Conversely, read addresses are always provided to array 34 from register 42. Multiplexer 48 is controlled by multiplexer control signals from control logic 62 to select the appropriate address path, based on the read/write control signals received by control logic 62. Thus, multiplexer 48 is controlled so that it selects the path from register 42 on read cycles (i.e., in the same cycle as that on which the read address is clocked into register 42) and the path from register 46 on write cycles which take place two cycles after the write cycle on which the first write address was received.

Some examples of the control of address pipeline 30 can be understood with reference to FIGS. 2a, 2b and 5. The first set of operations shown in FIG. 2a illustrate a write-write-write sequence. In such a sequence, write address $WA_1$ is received at memory 14 and clocked into register 42, e.g., on the rising edge of a clock signal (CLK) during clock cycle 1. On the next clock cycle (2), $WA_1$ is clocked into register 44 and $WA_2$ is clocked into register 42. On the third clock cycle (3), $WA_1$ is clocked into register 46, $WA_2$ is clocked into register 44 and $WA_3$ is clocked into register 42. At this time, multiplexer control signals from control logic 62 will be provided to multiplexer 48 to select the path to array 34 from register 46. Also, data $WD_1$, corresponding to $WA_1$, will have been clocked into register 52 in data pipeline 32 on clock cycle 3, so appropriate multiplexer control signals from control logic 62 are provided to multiplexer 58 to select the path from register 52 to array 34. Thus, address $WA_1$ and corresponding data $WD_1$ arrive at array 34 at the same time and the data is written to array 34 at the specified address.

The next set of operations shown in FIG. 2a illustrate a write-write-read sequence. In such a sequence, write address $WA_1$ is received at memory 14 and clocked into register 42, e.g., on the rising edge of a clock signal (CLK) during clock cycle 1. On the next clock cycle (2), $WA_1$ is clocked into register 44 and $WA_2$ is clocked into register 42. On the third clock cycle (3), $WA_1$ is clocked into register 46, $WA_2$ is clocked into register 44 and $RA_1$ is clocked into register 42. At this time, multiplexer control signals from control logic 62 will be provided to multiplexer 48 to select the path to array 34 from register 42 so that the read address can be immediately provided to the array. Data $WD_1$, corresponding to $WA_1$ will have been clocked into register 52 in data pipeline 32 on clock cycle 3, so appropriate multiplexer control signals from control logic 62 are provided to multiplexer 58 to prevent the path from register 52 to array 34 from being selected. Instead, address $WA_1$ and corresponding data $WD_1$ will be stored in their respective address and data pipelines 30 and 32, to arrive at array 34 at the same time for the data to be written to array 34 at the specified address.

At the same time $RA_1$ is provided to array 34, it is compared to $WA_1$ and $WA_2$ from registers 46 and 44, respectively, in compare unit 50. If $RA_1$ corresponds to $WA_1$, compare unit 50 will provide appropriate control signals to multiplexer 60 to select a path from register 52 (where $WD_1$ is stored), so that the appropriate data can be read out of memory 14 via register 56. If $RA_1$ corresponds to $WA_2$, compare unit 50 will provide appropriate control signals to multiplexer 60 to select a path from the data input (where $WD_2$ will be received on the next clock cycle), so that the appropriate data can be read out of memory 14 via register 56. Otherwise, compare unit 50 will provide appropriate control signals to multiplexer 60 to select a path from the array 34, so that the appropriate data can be read out of memory 14 via register 56.

The next set of operations shown in FIG. 2a illustrate a write-read-write sequence. In such a sequence, write address $WA_1$ is received at memory 14 and clocked into register 42, e.g., on the rising edge of a clock signal (CLK) during clock cycle 1. On the next clock cycle (2), $WA_1$ is clocked into register 44 and $RA_1$ is clocked into register 42. At this time, multiplexer control signals from control logic 62 will be provided to multiplexer 48 to select the path to array 34 from register 42 so that the read address can be immediately provided to the array. Compare unit 50 will also compare any stored addresses, including $WA_1$, to $RA_1$ as discussed above. On the third clock cycle (3), $WA_2$ is clocked into register 42. Data $WD_1$, corresponding to $WA_1$ will have been clocked into register 52 in data pipeline 32 on clock cycle 3, and is stored until the next write cycle, upon which the appropriate multiplexer control signals from control logic 62 are provided to multiplexer 58 to select the path from register 52 to array 34 so that the data may be written to array 34 at the specified address. Similar control sequences can be provided to allow for all of the read and write sequences shown in FIGS. 2a and 2b.

Figure 6:
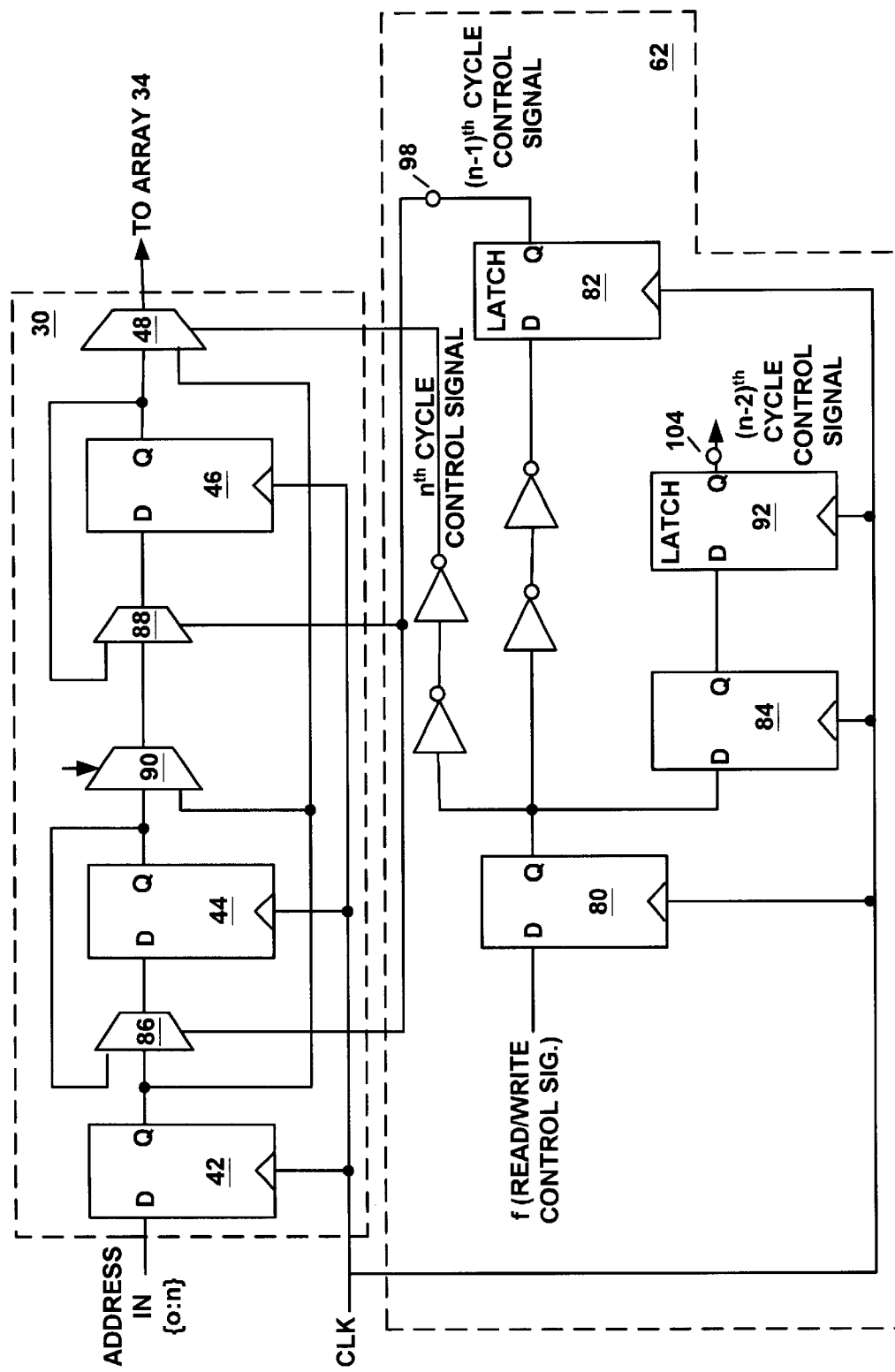
FIG. 6 illustrates a control algorithm for the address pipeline of the memory device shown in FIG. 5.

FIG. 6 illustrates one exemplary embodiment of address pipeline 30 and a logic implementation for control logic 62 which accomplish the desired functionality discussed above. To understand the control algorithm provided by this implementation, assume that the current clock cycle is the $n^{th}$ cycle, the previous clock cycle is the $(n-1)^{th}$ cycle, and the clock cycle previous to that was the $(n-2)^{th}$ cycle. In this embodiment, address bits stored in registers 44 and 46 of address pipeline 30 are passed further along the pipeline only if the previous cycle, i.e., the $(n-1)^{th}$ cycle, was a write. That is, the write address will be shifted along the address pipeline 30 if the last cycle was a write. Anytime the previous cycle is not a write, then the information in registers 44 and 46 is recirculated to feed the appropriate register's output back into its input. Because it is known one cycle in advance whether registers 44 and 46 will be clocked, the appropriate multiplexer control signals can be set-up on the previous cycle, thus removing any need for buffering in the signal path.

To illustrate, assume that two cycles previously, a write was received at memory 14 and a write address bit was stored in register 42. On the next cycle, i.e., the $(n-1)^{th}$ cycle, that bit would have been clocked into register 44. Now if another write cycle is received, the $n^{th}$ cycle, the write bit is clocked into register 46 only if the previous cycle $(n-1)$ was a write. At the same time, register 80 of control logic 62 receives a signal which is a function of the various read/write control signals received by memory 14 and provides a multiplexer control signal to multiplexer 48 to select the path from register 46. Thus, the write which was received two clock cycles ago is presented to array 34. If at any time during this process a read operation is received ($n^{th}$ cycle), the control signal from register 80 will allow multiplexer 48 to select the path from register 42 to allow the read address to be immediately presented to array 34. At the same time, the (n-1)th cycle control signal 98 from level triggered transparent latch 82 will cause any write data stored in address pipeline 30 (i.e., in registers 44 and 46) to be recirculated (i.e., using bypass multiplexers 86 and 88) within the pipeline. On the next write cycle, write data may need to be presented to array 34 from register 44 (e.g., via register 46 and depending on the operation of previous two cycles) and appropriate control signals for multiplexers 48 and 90 will be provided from control logic 62 to allow for such operations. Note that the $(n-2)^{th}$ cycle control signal 104 provided by register 84 and level triggered transparent latch 92 is used by data pipeline 32 as discussed below.

If a burst function were to be implemented, then two clock signals may be needed, one to drive the registers 42 and the other to drive registers 44 and 46. This is because in burst mode, register 42 may need to be turned off but the registers 44 and 46 may still need to be operated.

Figure 7:
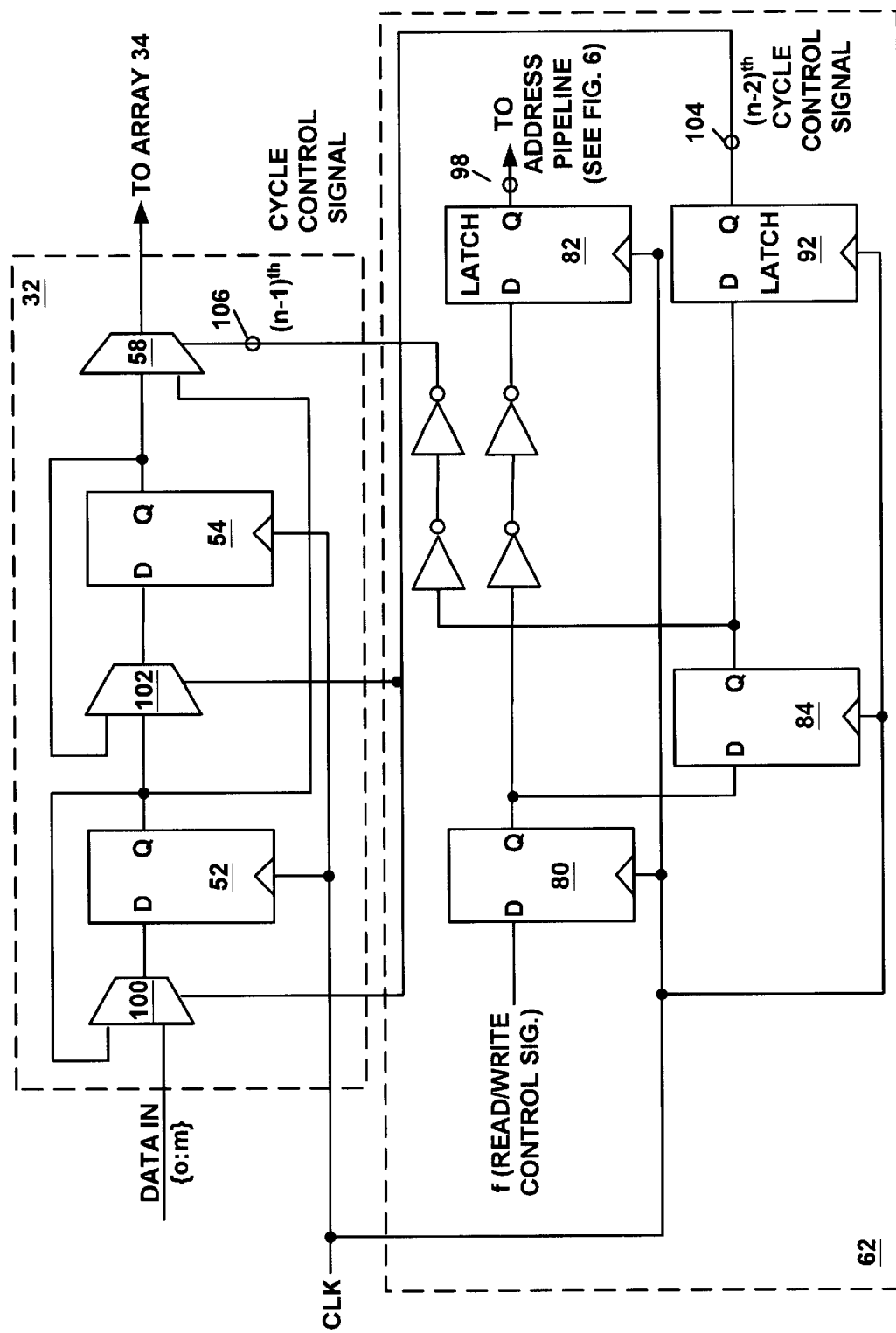
FIG. 7 illustrates a control algorithm for a data pipeline of the memory device shown in FIG. 5.

The operation of data pipeline 32 is discussed with reference to FIG. 7. To implement the above-described functionality, input data for array 34 may come from registers 54 or 52. If the previous cycle, $(n-1)^{th}$ cycle, was a read, then data is taken from register 54. Otherwise, data is taken from register 52. Data is passed from register 52 to register 54 only if two cycles previous, $(n-2)^{th}$ cycle, was a write. Otherwise the data is recirculated within the registers under the operation of bypass multiplexers 100 and 102. Control logic 62 provides the appropriate control signals using registers 80 and 84 and latch 92 to allow for this operation.

Continuing the example discussed above where the $(n-2)^{th}$ cycle is a write, upon the rising edge of the clock signal CLK associated with that cycle, register 80 will provide an output control signal from the input function of the read and write control signals provided to the memory device. This control signal is clocked by register 84 on the next rising edge of CLK (corresponding to the $(n-1)^{th}$ cycle). The resulting output signal is delayed so as to provide the $(n-1)^{th}$ cycle control signal 106 which arrives at multiplexer 58 in time to select the path to array 34 from the output of register 52 when the write data corresponding to the $(n-2)^{th}$ cycle is available. Also, the output of register 84 is clocked by level triggered latch 92 so as to provide the $(n-2)^{th}$ cycle control signal 104 to multiplexer 100 to allow the write data from the $(n-2)^{th}$ cycle to be captured by register 52. Similar control signal sequences are produced by the control logic 62 to produce the necessary multiplexer control signals for each of the read and write sequences shown in FIGS. 2a and 2b to allow for operation of the address pipeline 30 and data pipeline 32 under all conditions and subject to the above noted constraints.

Figure 8:
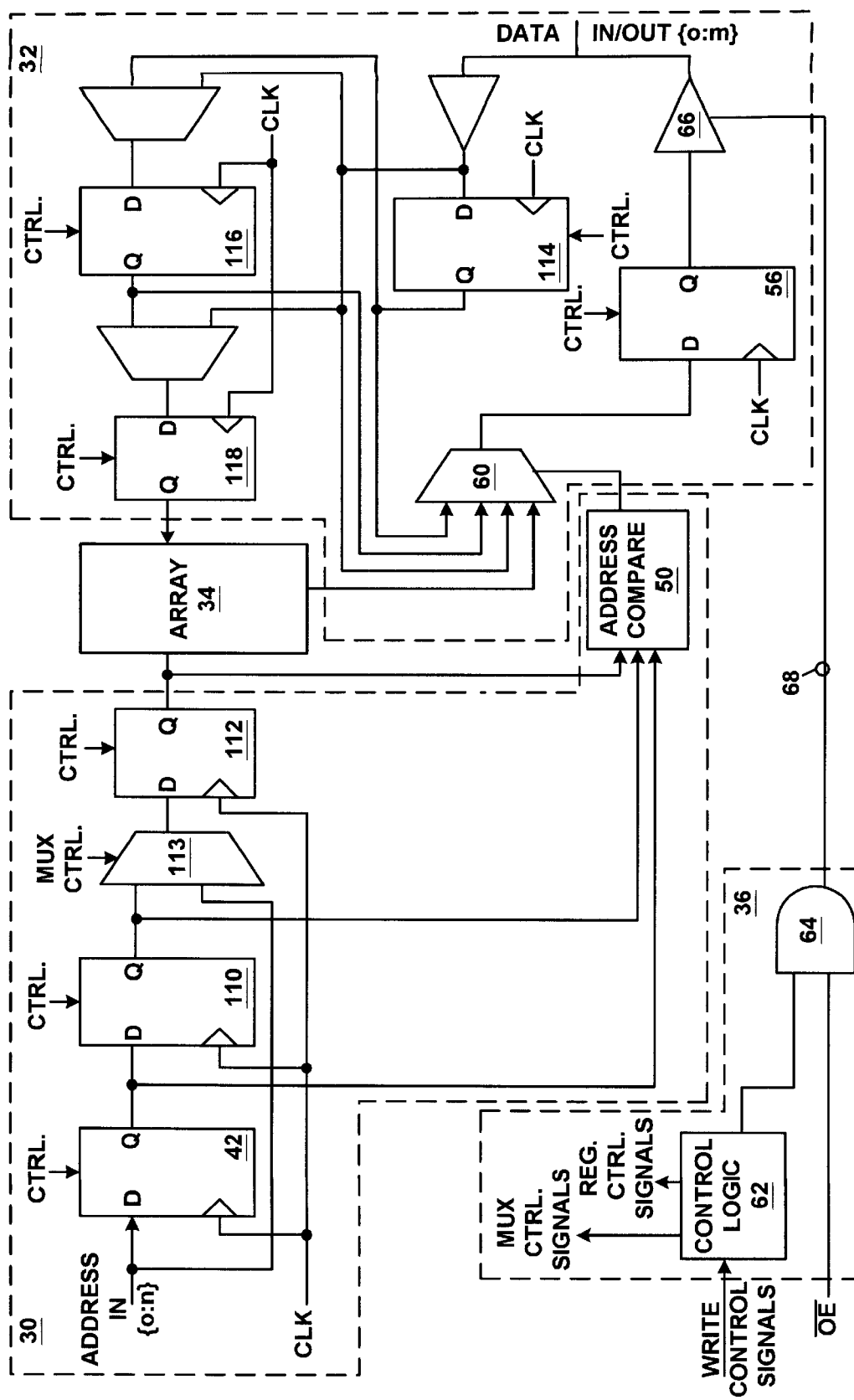
FIG. 8 illustrates a alternative embodiment for a memory device configured in accordance with the present invention.

FIG. 8 illustrates an alternative embodiment of memory 14. In this embodiment, address pipeline 30 includes registers 42, 110 and 112. Register 42 receives read and write addresses as before, however, in this case, two parallel paths from register 42 to array 34 are provided: one which includes register 110 and one which does not. Both of these paths share register 112. Similar functionality to that described above is provided by address pipeline 30 in that multiplexer 113 is operated under the control of control logic 62 so that write addresses are provided to array 34 two clock cycles after the address is received at memory 14. Read addresses are provided to array 34 immediately upon receipt thereof.

Similarly, data pipeline 32 operates to provided the same functionality as described above. In this embodiment, however, data pipeline 32 includes registers 56, 114, 116 and 118. Data received at memory 14 is clocked into register 114 and from there is provided to register 116 and/or output register 56 under the control of appropriate control signals from control logic 62. Such data may be directly provided as output from memory 14 (e.g., from register 56) when, for example, a read address received at memory 14 corresponds to a write address stored in address pipeline 30 (e.g., as determined by compare unit 50). This indicates that the most recent copy of the data is not stored in array 34 and must be provided from data pipeline 32 to satisfy the read operation. Data clocked into register 116 is provided to register 118 and array 34 on the next clock cycle.

Thus, a late write architecture for a memory device has been described. Although discussed with reference to specific exemplary embodiments, the present invention should only be measured in terms of the claims which follow.

What is claimed is:

1. A memory device, comprising an address pipeline configured to receive a write address at a first time and to provide said write address to a memory array of said memory device at a second time corresponding to a time when write data associated with said write address is available to be written to said memory array, said address pipeline comprising a first register configured to receive said write address and comprising a pair of parallel address paths coupled between said first register and said memory array, one of said pair of parallel address paths comprising a pair of registers including a second register and a third register, both of said pair of parallel address paths sharing said third register.

2. The memory device of claim 1 further comprising a comparator coupled to said address pipeline and configured to compare said write address to another address received at said memory device.

3. The memory device of claim 1 wherein said address pipeline includes a bypass path to said memory array for read addresses recovered at said memory device.

4. The memory device of claim 1 further comprising a data pipeline configured to receive data destined for said memory device and to provide said data to said memory array.

5. The memory device of claim 4 wherein said data pipeline includes a data bypass path which does not include said memory array.

* * * * *